(12) United States Patent
Yu et al.

(10) Patent No.: US 7,598,102 B1
(45) Date of Patent: Oct. 6, 2009

(54) METHOD FOR FABRICATING PIXEL STRUCTURE

(75) Inventors: Chou-Huan Yu, Taichung County (TW);
Chun-Yi Chiang, Taichung (TW);
Chia-Chi Tsai, Taipei (TW);
Chen-Pang Tung, Taipei (TW);
Hsiang-Chih Hsiao, Keelung (TW);
Chia-Ming Chang, Taipei County (TW);
Zong-Long Jhang, Taichung (TW);
Che-Yung Lai, Taichung County (TW);
Han-Tang Chou, Taoyuan (TW);
Jun-Kai Chang, Chiayi (TW); Ta-Wen Liao, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/183,071

(22) Filed: Jul. 31, 2008

(30) Foreign Application Priority Data

Jun. 2, 2008 (TW) ............................... 97120446 A (51) Int. Cl.
*H01L 21/00* (2006.01)
(52) U.S. Cl. ............................... 438/29; 438/30; 438/38; 257/59; 257/E21.09
(58) Field of Classification Search .................. 438/29, 438/30, 3, 998; 257/59, E21.09, E51.018
See application file for complete search history.

(56) References Cited

U.S. PATENT DOCUMENTS

| 5,919,532 | A | 7/1999 | Sato et al. |
| 7,022,537 | B2 * | 4/2006 | Moon et al. .................... 438/30 |
| 7,041,522 | B2 | 5/2006 | Tanaka et al. |
| 7,068,339 | B2 * | 6/2006 | Nakamura et al. .......... 349/152 |
| 7,236,220 | B2 * | 6/2007 | Kim et al. .................... 349/106 |
| 2002/0089615 | A1 | 7/2002 | Sakamoto et al. |
| 2005/0219433 | A1 * | 10/2005 | Oh et al. ........................ 349/42 |
| 2006/0186411 | A1 | 8/2006 | Kim et al. |
| 2007/0109467 | A1 | 5/2007 | Chang et al. |

* cited by examiner

*Primary Examiner*—Phuc T Dang
(74) *Attorney, Agent, or Firm*—Jianq Chyun IP Office (57) ABSTRACT

A fabricating method for a pixel structure including following procedures is provided. First, a gate and a gate insulator layer are formed sequentially on a substrate. Next, a semiconductor layer, a conductive layer and a photosensitive black matrix having a color filter containing opening are sequentially formed on the gate insulator layer. The photosensitive black matrix includes a first portion and a second portion. A thickness of the first portion is smaller than that of the second portion. A channel, a source and a drain are formed simultaneously using the photosensitive black matrix as a mask. A passivation is formed on the substrate, and a color filer layer is formed within the color filter containing opening via an inkjet printing process and a dielectric layer is formed thereon. Next, a patterning process is applied to expose the drain. Ultimately, a pixel electrode connected to the drain is formed.

14 Claims, 11 Drawing Sheets

METHOD FOR FABRICATING PIXEL STRUCTURE

CROSS-REFERENCE TO RELATED APPLICATION

This application claims the priority benefit of Taiwan application serial no. 97120446, filed on Jun. 2, 2008. The entirety of the above-mentioned patent application is hereby incorporated by reference herein and made a part of specification.

BACKGROUND OF THE INVENTION

1. Field of the Invention

The present invention is related to a method for fabricating a pixel structure, and particularly to a method using less photolithography and etching processes (PEP) to fabricate a pixel structure having a color filter layer.

2. Description of Related Art

With the advantages of high definition, small volume, light weight, low driving voltage, low power consumption and extensive application, the liquid crystal display (LCD) has replaced the cathode ray tube (CRT) as the mainstream of newly developed displays. The conventional LCD panel consists of a color filter substrate have a color filter layer, a thin film transistor (TFT) array substrate and a liquid crystal layer sandwiched therebetween. In order to enhance the resolution of the panel and the aperture ratio of the pixel and to avoid an aligning error when the color filter substrate is jointed to the TFT array substrate, a technique directly integrating a color filter layer to a TFT array substrate (hence, color filter on array, COA) is provided nowadays.

FIGS. 1A through 1G are schematic views showing a flowchart of fabricating a color filter layer on a TFT array. Three pixel structures are illustrated in FIGS. 1A through 1G as a representative example for explanation. First, referring to FIG. 1A, a substrate 10 is provided, and a gate 20 is formed thereon via a first PEP. Afterwards, referring to FIG. 1B, a gate insulator layer 30 is formed on the substrate 10 to cover the gate 20. A channel 40 and an ohmic contact layer 42 are formed on the gate insulator layer 30 over the gate 20 by performing a second PEP. Next, referring to FIG. 1C, a source 50 and a drain 60 are formed over a portion of the channel 40 and a portion of the gate insulator layer 30 by a third PEP. Generally, a material of the channel 40 is amorphous silicon (a-Si) and a material of the ohmic contact layer 42 is an N-type heavily-doped a-Si so that the contact impedance between the channel 40 and the source 50 and the contact impedance between the channel 40 and the drain 60 are reduced. The ohmic contact layer 42 is usually formed by performing N-type doping on a surface of the a-Si.

Figure 1A:
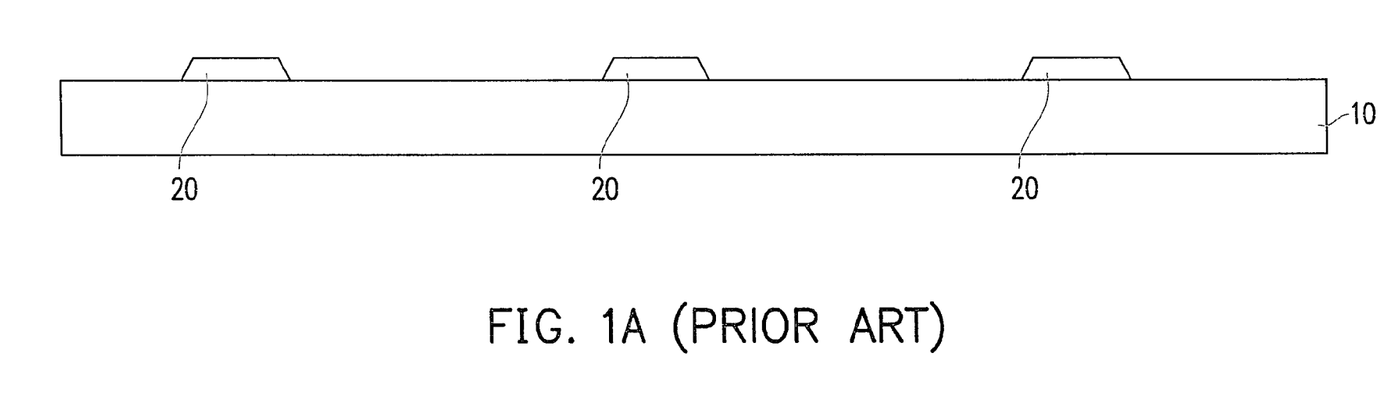
FIGS. 1A through 1G are schematic views showing a process flowchart of fabricating a color filter layer on a TFT array.
Figure 1B:
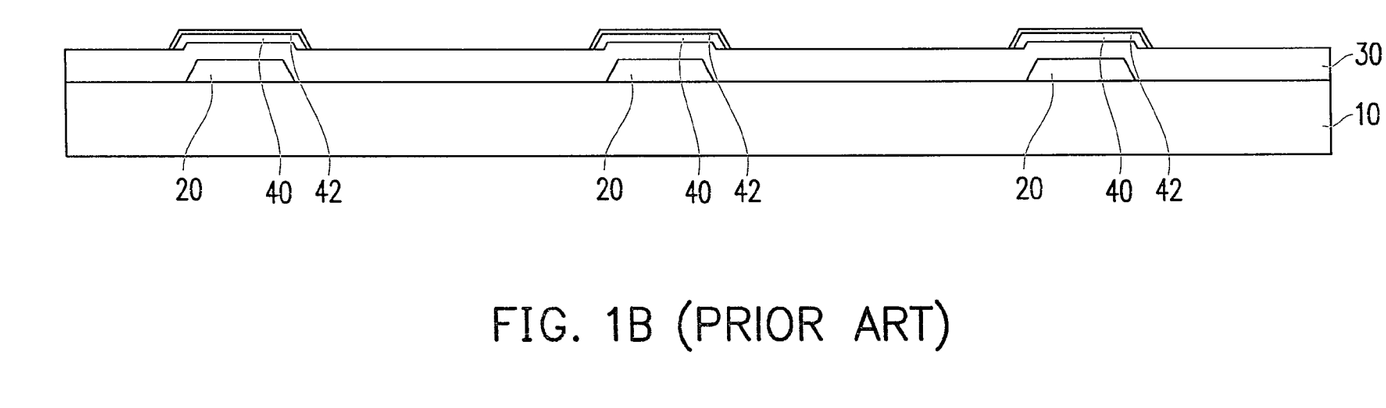
Figure 1C:
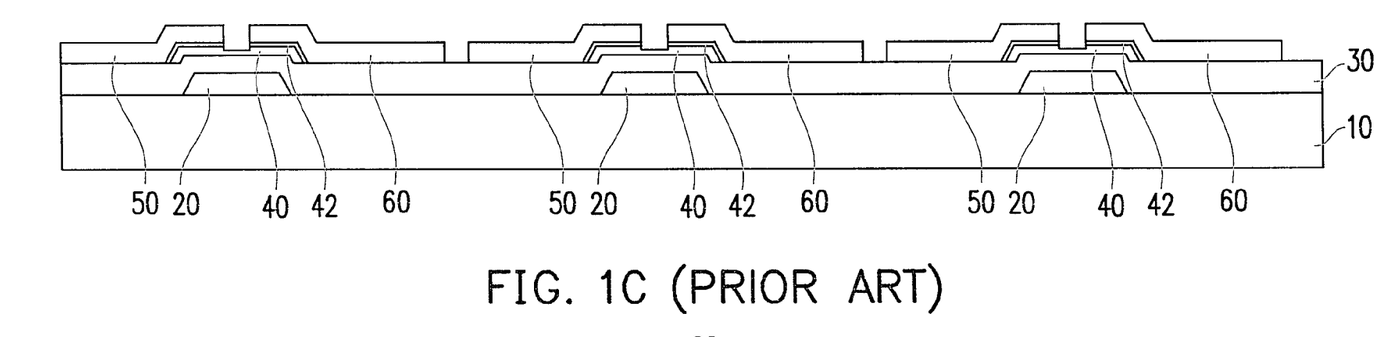
Figure 1D:
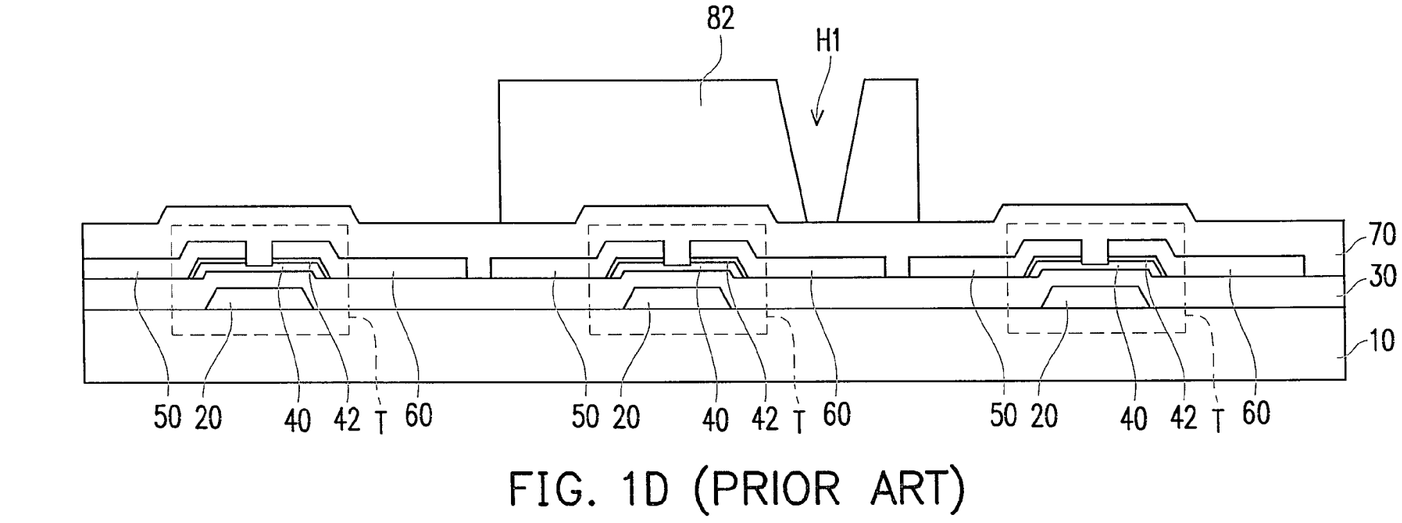

Referring again to FIG. 1C, the source 50 and the drain 60 extend respectively from two sides of the channel 40 to the gate insulator layer 30 and expose a portion of the channel 40. The gate 20, the channel 40, the source 50 and the drain 60 form a TFT T. Referring to FIG. 1D, a dielectric layer 70 covers the TFT T and a red filter pattern 82 is formed above a portion of the TFT T by a fourth PEP. The red filter pattern 82 has a contact opening H1 and the contact opening H1 is located over the drain 60 of the TFT T corresponding to the red filter pattern 82.

Figure 1E:
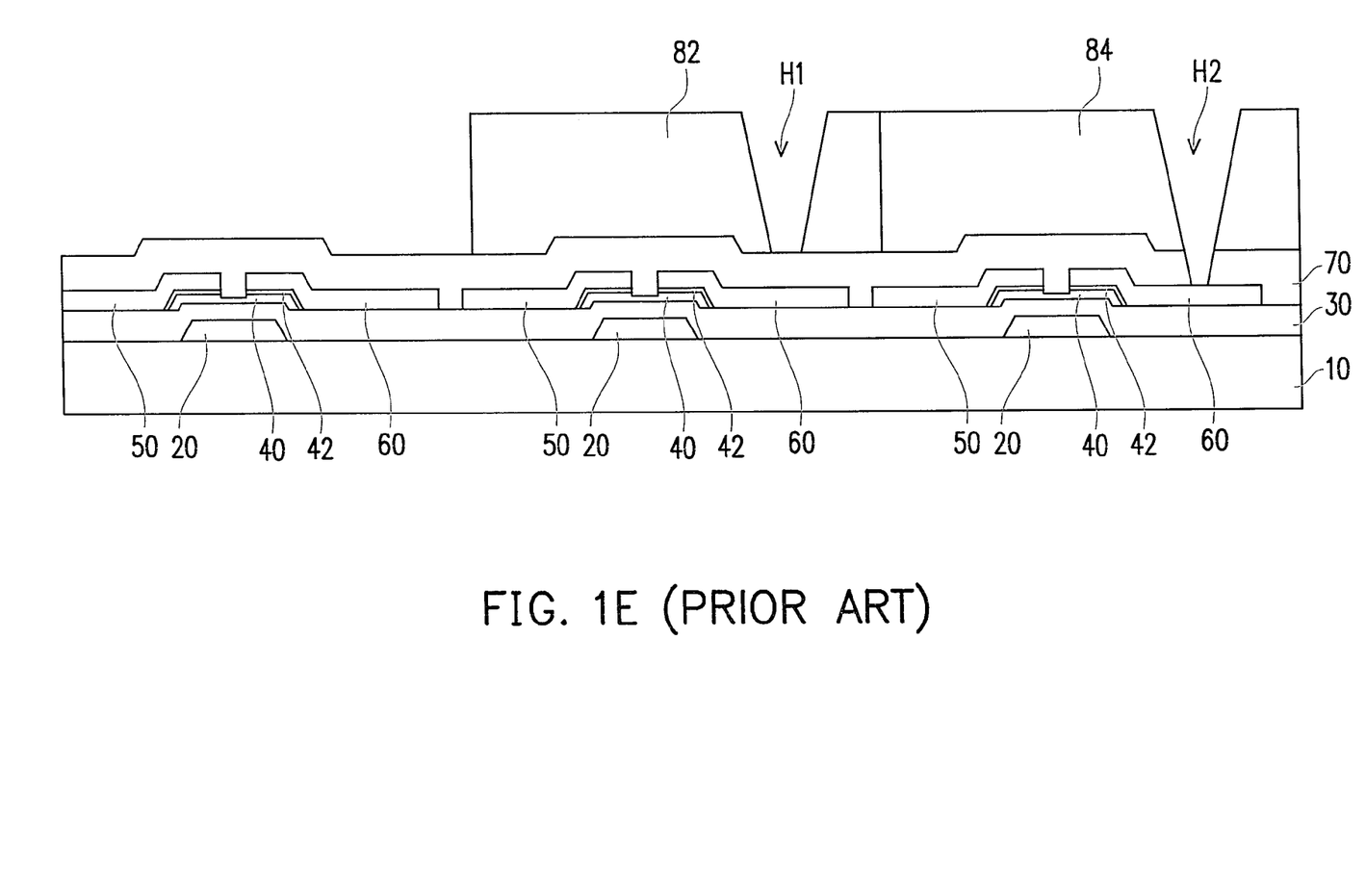
Figure 1F:
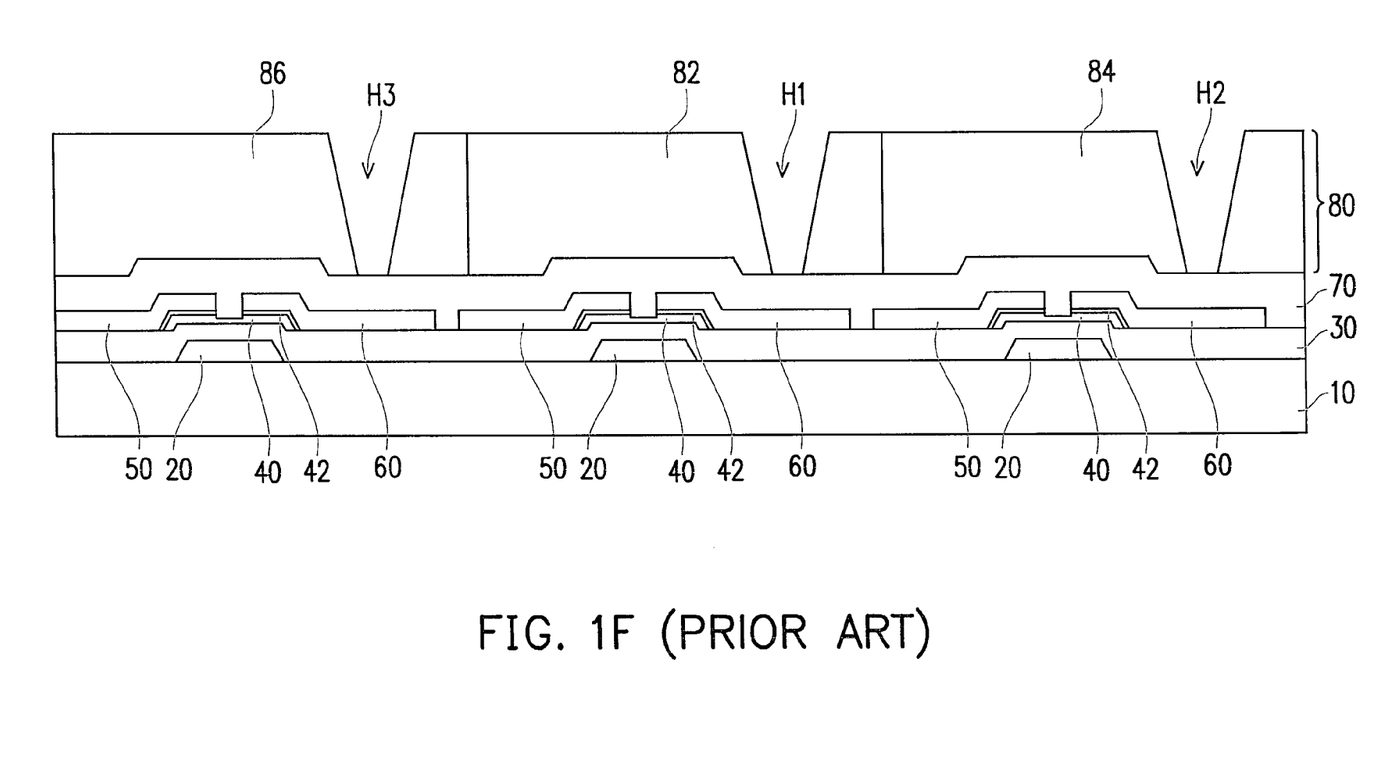

Referring to FIG. 1E, a green filter pattern 84 is formed over a portion of the TFT T by a fifth PEP and a contact opening H2 is formed in the green filter pattern 84. The contact opening H2 is located over the drain 60 of the TFT T corresponding to the green filter pattern 84. Referring to FIG. 1F, a blue filter pattern 86 is formed over a portion of the TFT T by a sixth PEP and a contact opening H3 is formed in the blue filter pattern 86. The contact opening H3 is located over the drain 60 of the TFT T corresponding to the blue filter pattern 86. It is known from FIGS. 1D through 1F that a color filter layer 80 formed by the red filter pattern 82, the green filter pattern 84 and the blue filter pattern 86 is fabricated by three PEPs.

Figure 1G:
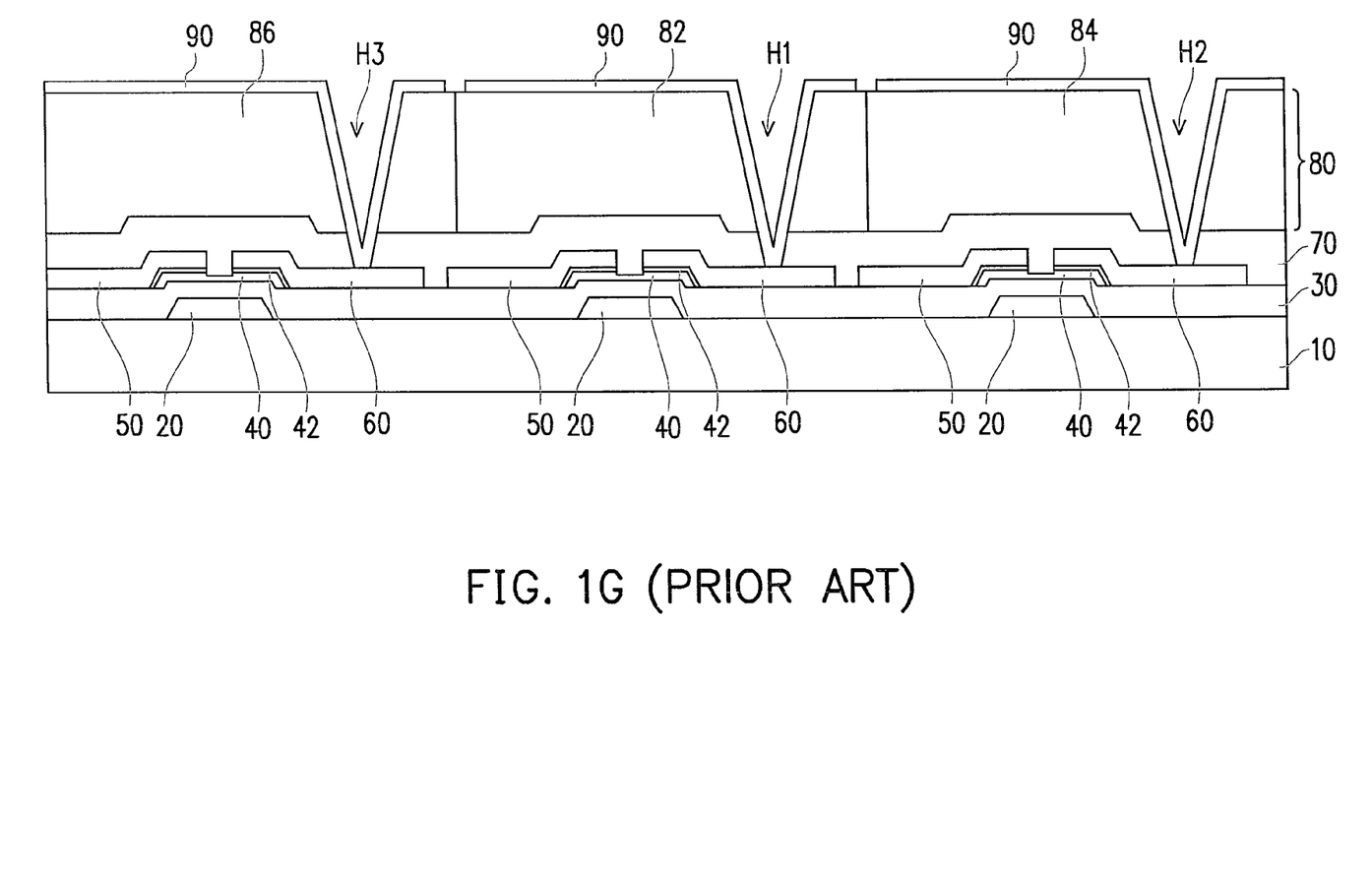

Afterwards, referring to FIG. 1G, the dielectric layer 70 exposed by the contact openings H1, H2 and H3 is removed to expose the drains 60 by an etching process. Then, a pixel electrode 90 is formed on the color filter layer 80 by a seventh PEP. It is known from FIG. 1G that the pixel electrode 90 of each pixel structure is electrically connected to each drain 60 through the contact openings H1, H2 and H3 corresponding thereto respectively. Up until this procedure, direct integration of the color filter layer 80 to the TFT array substrate is substantially completed.

In view of the foregoing, the conventional method requires at least seven PEPs to complete fabrication of the color filter layer on the TFT array substrate. The procedures are complicated and thus require a higher fabricating cost. Moreover, the pixel structure fabricated by at least seven PEPs as described above uses a plurality of masks with different patterns. Since masks are rather expensive, the fabricating cost of the LCD panel cannot be reduced.

SUMMARY OF THE INVENTION

The present invention is directed to a method for fabricating a pixel structure suitable for reducing a fabricating cost thereof.

The present invention provides a method for fabricating a pixel structure, in which a gate is first formed on a substrate. Thereafter, a gate insulator layer is formed on the substrate to cover the gate. Next, a semiconductor layer, a conductive layer and a photosensitive black matrix are sequentially formed on the gate insulator layer. The photosensitive black matrix has a color filter containing opening and includes a first portion and a second portion. A thickness of the first portion is smaller than a thickness of the second portion. Then, the photosensitive black matrix is used as a mask to form a channel, a source and a drain simultaneously on the gate insulator layer over the gate. The gate, the channel, the source and the drain form a TFT. Afterwards, a passivation is formed on the photosensitive black matrix, the TFT and the gate insulator layer. A color filter layer is formed in the color filter containing opening by an inkjet printing process. Then, a dielectric layer is formed on the black matrix and the color filter layer. The dielectric layer and the passivation are patterned to expose the drain. A pixel electrode electrically connected to the drain is thus formed.

According to the method for fabricating the pixel structure in the present invention, forming the channel, the source and the drain simultaneously includes using the photosensitive black matrix as a mask first to remove a portion of the conductive layer and the semiconductor layer exposed by the photosensitive black matrix so as to form the channel. Afterwards, the thickness of the photosensitive black matrix is reduced until the first portion is entirely removed. Then, the remaining second portion is used as a mask to remove the conductive layer exposed by the second portion so that the source and the drain are formed on the channel. Removing a portion of the conductive layer and the semiconductor layer exposed by the photosensitive black matrix includes performing a wet etching process or a dry etching process. Further, reducing the thickness of the photosensitive black matrix includes performing a dry etching process. The dry etching process is an ashing process, for example. Removing the conductive layer exposed by the second portion includes performing a wet etching process or a dry etching process.

According to the present invention, the method for fabricating the pixel structure further includes forming an ohmic contact layer on a surface of the semiconductor layer after the semiconductor layer is formed.

According to the method for fabricating the pixel structure of the present invention, patterning the dielectric layer and the passivation includes first forming a photoresist layer on the dielectric layer, for example. Thereafter, a portion of the dielectric layer, a portion of the photosensitive black matrix and a portion of the passivation are removed using the photoresist layer as a mask to form an opening within the dielectric layer and the passivation.

According to the method for fabricating the pixel structure of the present invention, forming the pixel electrode includes first forming an electrode material layer on the dielectric layer and the exposed drain. Then, the electrode material layer is patterned.

According to the present invention, while forming the gate, the method for fabricating the pixel structure further includes forming a first capacitor electrode, and while forming the channel, the source and the drain simultaneously, the method further includes forming the semiconductor layer and a second capacitor electrode. The first capacitor electrode and the second capacitor electrode constitute a storage capacitor.

According to the fabricating method of the present invention, fabrication of the black matrix is integrated with that of the channel, the source and the drain of the TFT in the same PEP, and the inkjet printing technique is also adopted to fabricate the color filter layer over the TFT. Hence, compared with the conventional fabricating method of the pixel structure, the procedures in the process of the present invention are simplified and the fabricating cost on the PEPs is lowered. Furthermore, when the inkjet printing technology is used to fabricate the color filter layer, consumption of material for the color filter layer is effectively decreased such that the fabricating cost is further reduced.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A' is a top view of FIG. 2A.
FIG. 2E' is a top view of FIG. 2E.
FIG. 2G' is a top view of FIG. 2G.
FIG. 2H' is a top view of FIG. 2H.

DESCRIPTION OF EMBODIMENTS

Figure 2A:
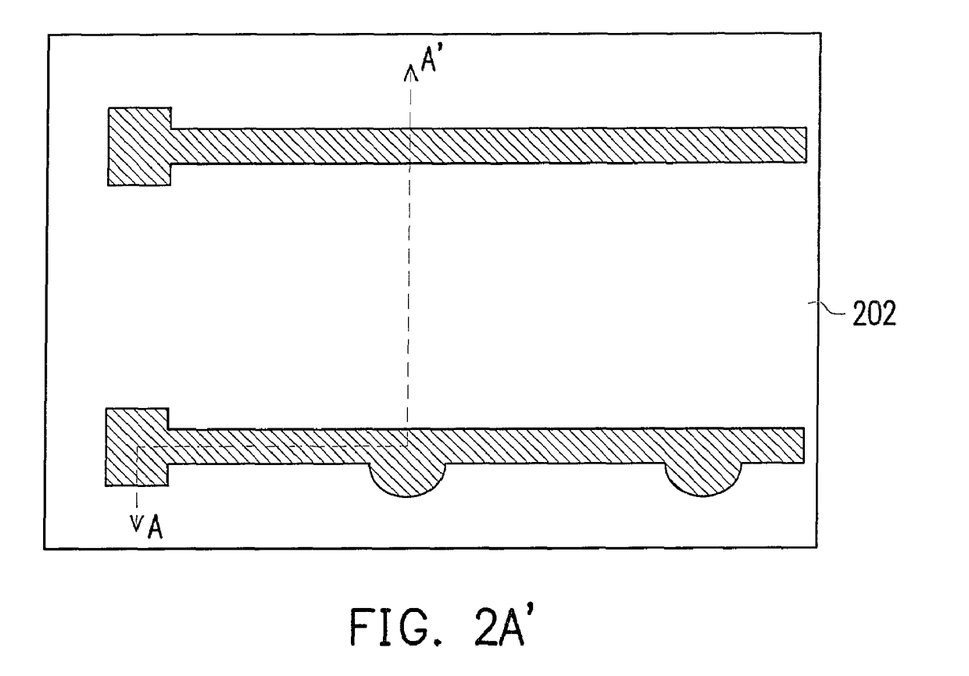
FIGS. 2A through 2H are schematic views showing a process flowchart of fabricating a pixel structure according to the present invention.

FIGS. 2A through 2H are schematic views showing a process flowchart of fabricating a pixel structure according to the present invention. FIGS. 2A', 2E', 2G' and 2H' are top views of FIGS. 2A, 2E, 2G and 2H, respectively. Specifically, FIGS. 2A', 2E', 2G' and 2H' are schematic cross-sectional views of FIGS. 2A, 2E, 2G and 2H along lines AA' respectively. Referring to FIGS. 2A and 2A', a substrate 202 is provided first. A material of the substrate 202 includes glass, plastic, and other rigid or soft materials, for example. Next, a gate 212 is formed on the substrate 202. The gate 212 is fabricated by forming a conductive layer (not shown) on an entire surface of the substrate 212 first through sputtering, evaporation or other thin film deposition techniques and then performing a patterning process. The aforesaid patterning process is, for example, a photolithography and etching process (PEP). Additionally, while forming the gate 212 in the present embodiment, a first capacitor electrode 214 may also be optionally formed simultaneously.

Figure 2B:
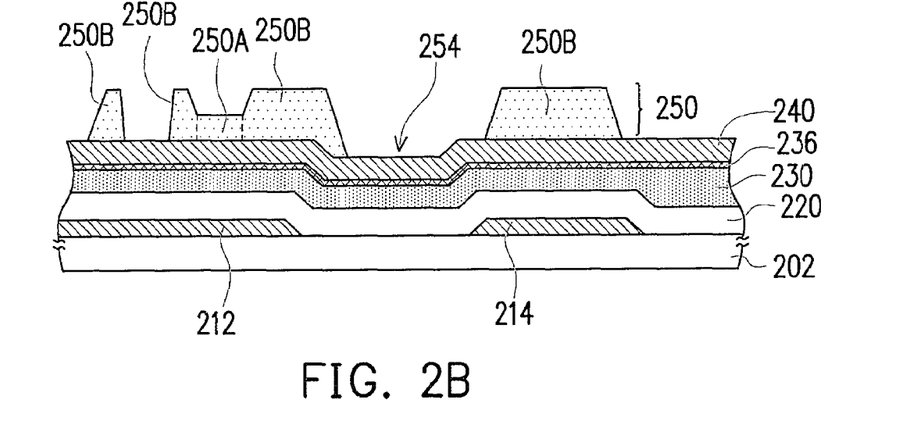

Next, referring to FIG. 2B, a gate insulator layer 220 is formed on the substrate 202 to cover the gate 212 and the first capacitor electrode 214. The gate insulator layer 220 is formed by chemical vapor deposition (CVD), for example, or other suitable thin film deposition techniques. A material of the gate insulator 220 is a dielectric material, such as silicon oxide, silicon nitride or silicon oxynitride. Thereafter, as shown in FIG. 2B, a semiconductor layer 230, a conductive layer 240 and a photosensitive black matrix 250 are sequentially formed on the gate insulator layer 220 over the gate 212. In the present embodiment, after forming the semiconductor layer 230, an ohmic contact layer 236 may be further formed on a surface of the semiconductor layer 230. A material of the semiconductor layer 230 is, for example, amorphous silicon (a-Si) and a material of the conductive layer 240 is, for example, aluminum (Al), molybdenum (Mo), titanium (Ti), neodymium (Nd), any nitride of the foregoing, e.g., MoN, TiN, any stacked layer thereof, any alloy of the foregoing or other conductive materials. A material of the photosensitive black matrix 250 includes black resin, for example.

As shown in FIG. 2B, the photosensitive black matrix 250 has a color filter containing opening 254 and includes a first portion 250A and a second portion 250B, in this embodiment, the first portion 250A is adjacent between two second portions 250B. A thickness of the first portion 250A is smaller than a thickness of the second portion 250B. More specifically, forming the photosensitive black matrix 250 includes forming a material layer (not shown) on the conductive layer 240 first and then patterning the material layer through a half-tone mask process or a gray-tone mask process so as to form the first portion 250A and the second portion 250B with different thicknesses at two sides of the first portion 250A in the photosensitive black matrix 250. The material layer is formed by, for example, spin coating, slit/spin coating or spin-less coating so as to coat the material layer on the conductive layer 240. Patterning the material layer includes procedures such as soft baking, exposure, development and hard baking.

Figure 2C:
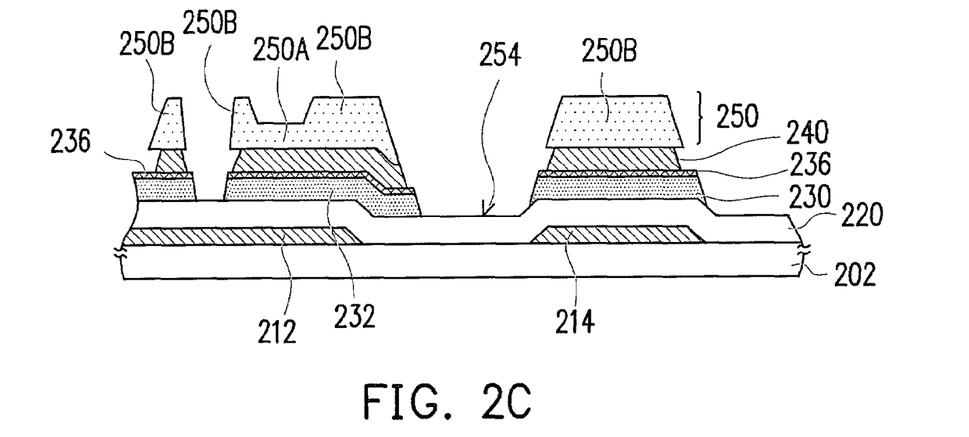
Figure 2D:
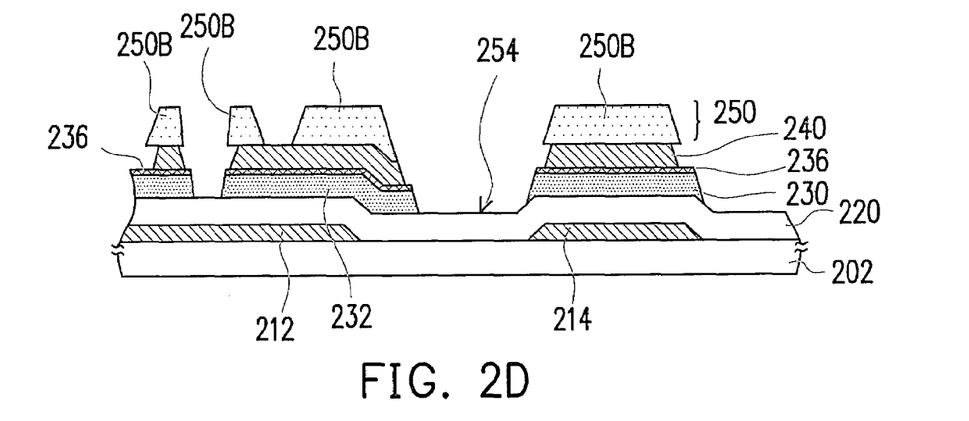

Thereafter, referring to FIG. 2C, the photosensitive black matrix 250 is used as a mask to remove a portion of the conductive layer 240 and the semiconductor layer 230 exposed by the photosensitive black matrix 250 so as to form a channel 232. Removing the portion of the conductive layer 240 and the portion of the semiconductor layer 230 exposed by the photosensitive black matrix 250 includes performing a wet etching process first and then performing a dry etching process, for example. Next, referring to FIG. 2D, the thickness of the photosensitive black matrix 250 is reduced until the first portion 250A is entirely removed such that the channel 232 is partially exposed by the photosensitive black matrix 250. The thickness of the photosensitive black matrix 250 may be reduced by performing a dry etching process, such as an ashing process.

Figure 2E:
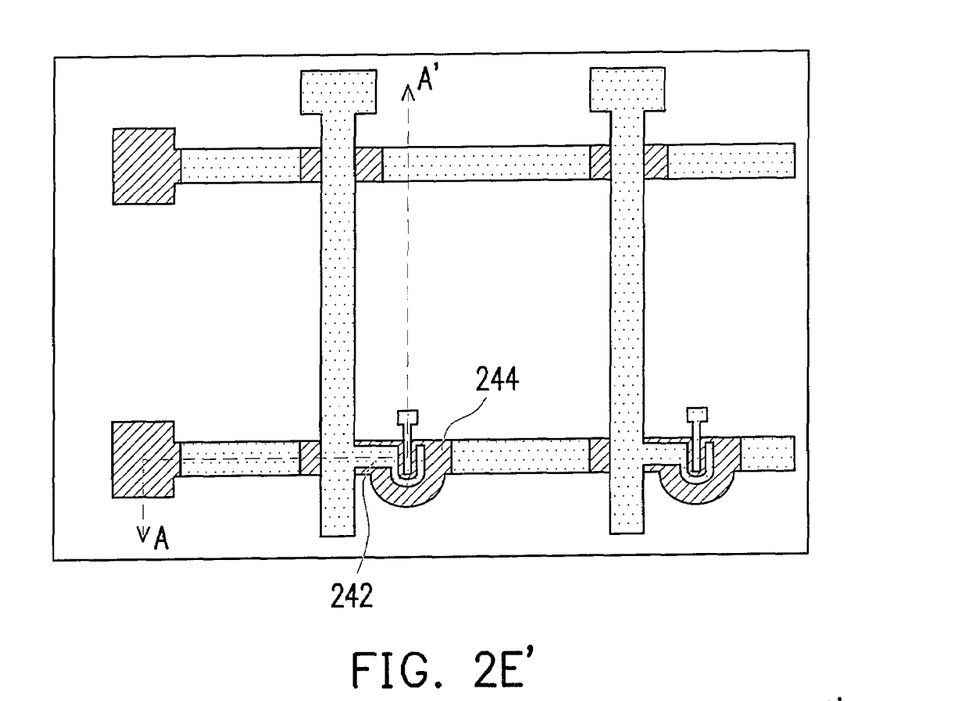

Next, referring to FIG. 2E and its top view FIG. 2E', the remaining second portion 250B is used as a mask to remove the conductive layer 240 exposed by the second portion 250B so as to form a source 242 and a drain 244 on the channel 232. The gate 212, the channel 232, the source 242 and the drain 244 constitute a TFT T. In the present embodiment, the ohmic contact layer 236 exposed by the second portion 250B is removed altogether. Removing the conductive layer 240 exposed by the second portion 250B includes performing a wet etching process or a dry etching process, for example. It should be noted that as shown in FIG. 2E the ohmic contact layer 236 is formed between the channel 232 and the source 242 and between the channel 232 and the drain 244 in order to reduce a contact impedance between the channel 232 and the source 242 and a contact impedance between the channel 232 and the drain 244 so that device characteristics of the TFT T are enhanced. However, the present invention is not limited to the arrangements in this embodiment.

It is to be noted that unlike the conventional art, in the present invention, the photosensitive black matrix 250 is used as a mask to form the channel 232, the source 242 and the drain 244 simultaneously on the gate insulator layer 220 over the gate 212. In other words, the photosensitive black matrix 250, the channel 232, the source 242 and the drain 244 of the present invention may be formed altogether in the same mask process. Consequently, a PEP is spared and complexity of the entire process is reduced. In addition, as shown in FIG. 2E, while forming the channel 232, the source 242 and the drain 244 in the present embodiment, the semiconductor layer 230, the ohmic contact layer 236 and a second capacitor electrode 246 may be optionally formed over the first capacitor electrode 214. As a result, the first capacitor electrode 214 and the second capacitor electrode 246 constitute a storage capacitor C.

Figure 2F:
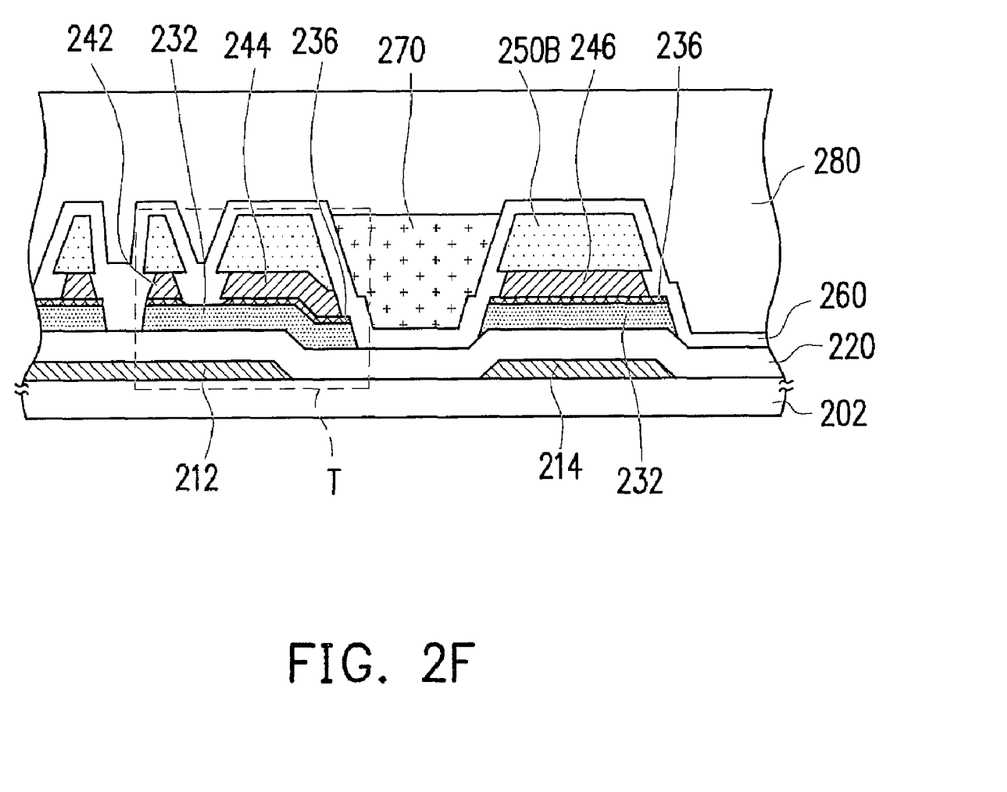

Afterwards, referring to FIG. 2F, a passivation 260 is formed on the photosensitive black matrix 250, the TFT T and the gate insulator layer 220. A material of the passivation 260 may be an inorganic dielectric material, such as silicon oxide, silicon nitride or silicon oxynitride. The passivation 260 is usually formed through deposition on an entire surface of the substrate 202 by performing physical vapor deposition (PVD) process or chemical vapor deposition (CVD) process.

Continuing to refer to FIG. 2F, after forming the passivation 260, a color filter layer 270 is formed in a color filter containing opening 254 by an inkjet printing process, wherein a material of the color filter layer 270 is, for example, acrylic resin. In practice, the color filter layer is directly integrated in the technology of the array substrate of the TFT T. Each pixel structure has the color filter layer 270 disposed over the TFT T and the color filter layer 270 includes a red filter pattern, a green filter pattern and a blue filter pattern so that the LCD panel achieves a full-color displaying.

In more detail, in the present embodiment, the filter patterns of different colors in the color filter layer 270 are fabricated by an inkjet printing process. The inkjet printing process includes first performing a surface treatment process on the substrate 202 and then injecting color ink through nozzles containing red (R), green (G) or blue (B) ink into the color filter containing opening 254 predetermined for the red, green or blue filter patterns to be formed therein. Then, a baking process is performed so that the color ink is curing and forms the color filter layer 270. It should be noted that in the present embodiment the red filter pattern, the green filter pattern and the blue filter pattern are simultaneously formed in the pixel structures of the LCD panel without requiring any PEP process. Consequently, the fabricating cost is significantly decreased, and the complexity of the process reduced and the yield is thereby increased. Certainly, the present invention does not limit the color, the number and the depositions of the filter patterns, which may vary depending upon actual design requirements.

Thereafter, continuing to refer to FIG. 2F, a dielectric layer 280 is formed on the photosensitive black matrix 250, the color filter layer 270 and the passivation 260. The dielectric layer 280 may be constituted by organic dielectric materials such as acrylic resin and photosensitive resin. The dielectric layer 280 is formed by coating the material layer on the passivation 260 via spin coating, slit/spin coating or spin-less coating, for example.

Figure 2G:
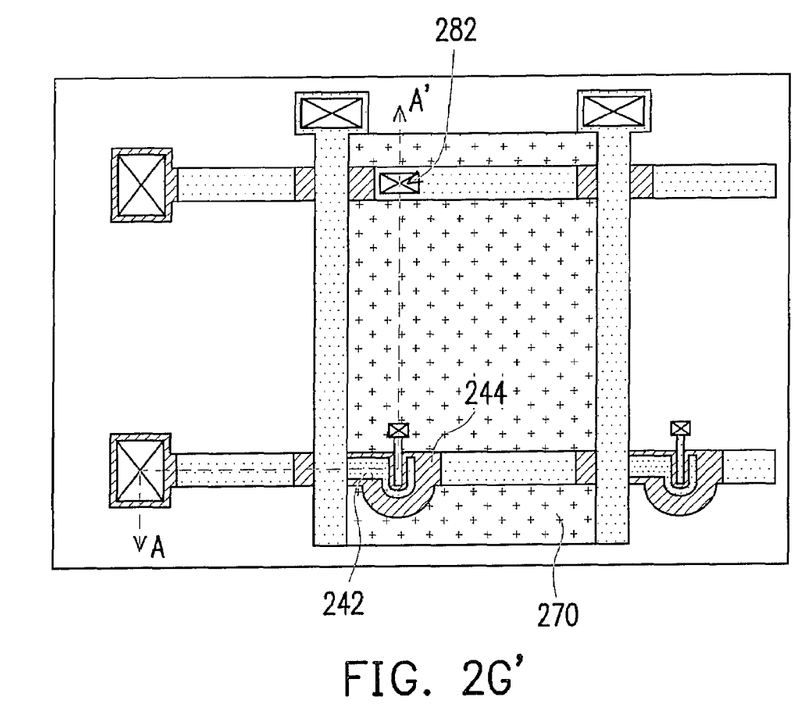

Next, referring to FIG. 2G and its top view FIG. 2G', the dielectric layer 280 and the passivation 260 are patterned to expose the drain 244. Patterning the dielectric layer 280 and the passivation 260 includes, for example, forming a photoresist layer (not shown) first on the dielectric layer 280. Alternatively, the material of the dielectric layer 280 is photosensitive and does not require the said photoresist layer. Then, the photoresist layer (not shown) is used as a mask to remove a portion of the dielectric layer 280, a portion of the photosensitive black matrix 250 and a portion of the passivation 260 so as to form an opening 281 in the dielectric layer 280 and the passivation 260. The drain 244 is disposed within a range covered by the opening 281. Furthermore, in the present embodiment, the patterned dielectric layer 280, the patterned passivation 260 and the patterned photosensitive black matrix 250 altogether expose the second capacitor electrode 246, as an opening 282 shown in FIG. 2G. If the material of the dielectric layer 280 is photosensitive, meaning that the material of the dielectric layer 280 is a photoresist material, patterning the dielectric layer 280 and the passivation 260 includes first patterning the dielectric layer 280 and using the patterned dielectric layer 280 as a mask to remove a portion of the passivation 260 and a portion of the photosensitive black matrix 250 so as to form the opening 282 in the dielectric layer 280 and the passivation 260.

Figure 2H:
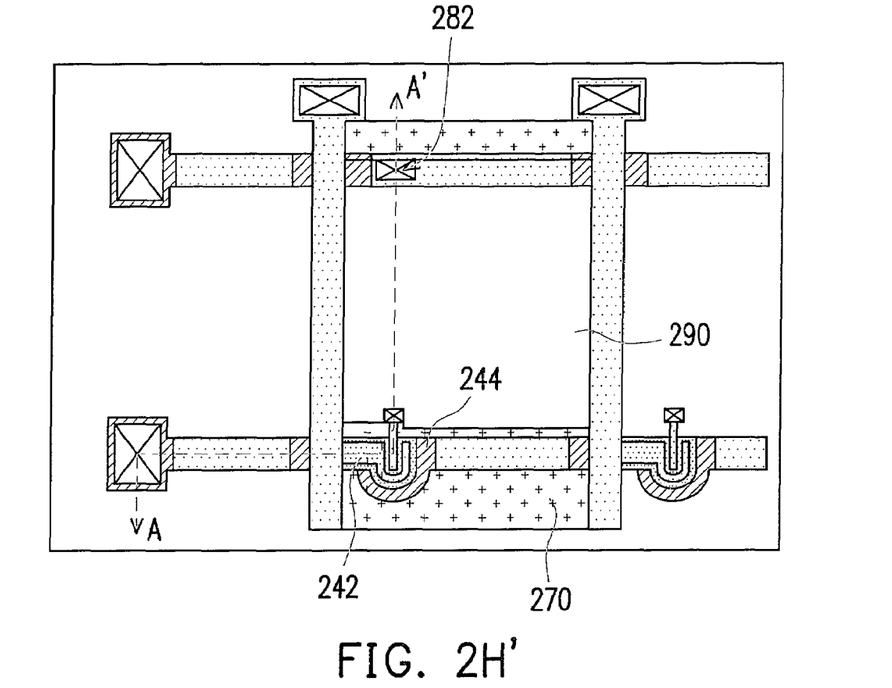

Afterwards, referring to FIG. 2H and its top view FIG. 2H', a pixel electrode 290 electrically connected to the drain 244 is formed. Forming the pixel electrode 290 includes first forming an electrode material layer on the dielectric layer 280. Next, the electrode material layer is patterned to form the pixel electrode 290. Forming the electrode material layer includes forming an indium tin oxide (ITO) layer or an indium zinc oxide (IZO) layer by sputtering. According to the present embodiment, the pixel electrode 290 is electrically connected to the second capacitor electrode 246 through the opening 282 such that the first capacitor electrode 214 and the pixel electrode 290 constitute a metal-insulator-metal (MIM) type storage capacitor, which is used for stabilizing data voltages in the pixel structure. Moreover, the second capacitor electrode 246 may also be spared such that the first capacitor electrode 214 and the pixel electrode 290 constitute a metal-insulator-ITO (MII) type storage capacitor. However, the second capacitor electrode 246 may also be formed while forming the source 242 and the drain 244. The second capacitor electrode 246 may be not electrically connected to the pixel electrode 290 or may be electrically connected to the first capacitor electrode 214. The second capacitor electrode 246 and the pixel electrode 290 have different voltage levels and thus the second capacitor electrode 246 and the pixel electrode 290 constitute a metal-insulator-ITO (MII) type storage capacitor.

Through the foregoing procedures as shown in FIGS. 2A through 2H, a pixel structure 200 is obtained. It should be noted that unlike the prior art where seven PEPs are required to fabricate a pixel structure. In the present invention, only four PEPs and inkjet printing processes are required to directly integrate the color filter layer onto the TFT array substrate. Compared with the prior art, in the present invention, not only do a plurality of PEPs and the complexity of the entire process are reduced, but the amount of material used for the color filter layer also is effectively decreased, thereby lowering the cost for material consumption.

In summary, the method for fabricating the pixel structure provided by the present invention has at least the following advantages.

1. In the method for fabricating the pixel structure provided by the present invention, the color filter does not require performing a photolithography process to be fabricated. Therefore, compared with the conventional photolithography and etching process (PEP) which needs to be performed with high precision, the present invention is conducive to reducing the total cost required for the PEPs.

2. Given that fewer procedures are involved in the fabricating the pixel structure in the present invention, defects caused during the long photolithography process while fabricating the pixel structure (such as photoresist coating, soft baking, hard baking, exposure, development, etching, photoresist stripping, and the like) are reduced.

3. The color filter layer of the present invention adopts an inkjet printing process and therefore compared with the photolithography process the material cost is effectively reduced, thereby lowering the fabricating cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a pixel structure, the method comprising:
   forming a gate on a substrate;
   forming a gate insulator layer on the substrate to cover the gate;
   forming a semiconductor layer, a conductive layer and a photosensitive black matrix sequentially on the gate insulator layer, wherein the photosensitive black matrix has a color filter containing opening and includes a first portion and a second portion, and wherein a thickness of the first portion is smaller than a thickness of the second portion;
   forming a channel, a source and a drain simultaneously on the gate insulator layer over the gate using the photosensitive black matrix as a mask, wherein the gate, the channel, the source and the drain constitute a thin film transistor (TFT);
   forming a passivation on the photosensitive black matrix, the TFT and the gate insulator layer;
   forming a color filter layer in the color filter containing opening by an inkjet printing process;
   forming a dielectric layer on the black matrix and the color filter layer;
   patterning the dielectric layer and the passivation to expose the drain; and
   forming a pixel electrode electrically connected to the drain.

2. The method as claimed in claim 1, wherein forming the channel, the source and the drain simultaneously comprises:
   using the photosensitive black matrix as a mask to remove a portion of the conductive layer and the semiconductor layer exposed by the photosensitive black matrix so as to form the channel;
   reducing the thickness of the photosensitive black matrix until the first portion is entirely removed; and
   removing the conductive layer exposed by the second portion using the remaining second portion as a mask so that the source and the drain are formed on the channel.

3. The method as claimed in claim 2, wherein removing the portion of the conductive layer and the semiconductor layer exposed by the photosensitive black matrix comprises performing a wet etching process or a dry etching process.

4. The method as claimed in claim 2, wherein reducing the thickness of the photosensitive black matrix comprises performing a dry etching process.

5. The method as claimed in claim 4, wherein the dry etching process comprises an ashing process.

6. The method as claimed in claim 2, wherein removing the conductive layer exposed by the second portion comprises performing a wet etching process or a dry etching process.

7. The method as claimed in claim 1, further comprising forming an ohmic contact layer on a surface of the semiconductor layer.

8. The method as claimed in claim 1, wherein patterning the dielectric layer and the passivation comprises:
   forming a photoresist layer on the dielectric layer; and
   removing a portion of the dielectric layer, a portion of the photosensitive black matrix and a portion of the passivation using the photoresist layer as a mask so as to form an opening within the dielectric layer and the passivation.

9. The method as claimed in claim 1, wherein forming the pixel electrode comprises:
   forming an electrode material layer on the dielectric layer and the exposed drain; and
   patterning the electrode material layer.

10. The method as claimed in claim 1, further comprising:
    forming a first capacitor electrode while forming the gate; and
    forming the semiconductor layer and a second capacitor electrode while forming the channel, the source and the drain, wherein the first capacitor electrode and the second capacitor electrode constituting a storage capacitor.

11. The method as claimed in claim 1, wherein a material of the dielectric layer comprises a photoresist material.

12. The method as claimed in claim 1, wherein patterning the dielectric layer and the passivation comprises:
    patterning the dielectric layer; and
    removing a portion of the passivation and a portion of the photosensitive black matrix by using the patterned dielectric layer as a mask so as to form an opening within the dielectric layer and the passivation.

13. The method as claimed in claim 1, further comprising forming a first capacitor electrode while forming the gate, wherein the first capacitor electrode and the pixel electrode constitute a storage capacitor.

14. The method as claimed in claim 1, further comprising forming the semiconductor layer and a second capacitor electrode while forming the channel, the source and the drain, wherein the second capacitor electrode and the pixel electrode constitute a storage capacitor.

* * * * *